United States Patent
Warren et al.

(10) Patent No.: US 11,929,750 B2
(45) Date of Patent: Mar. 12, 2024

(54) DEVICE WITH CLOCK TERMINAL AND METHOD FOR OPERATING A DEVICE

(71) Applicant: ams-OSRAM AG, Premstaetten (AT)

(72) Inventors: Dewight Warren, Dallas, TX (US); Bingbing Xu, Suzhou (CN); Bernhard Greimel-Laengauer, Gleisdorf (AT); Franz Stelzl, Hitzendorf (AT)

(73) Assignee: ams-OSRAM AG, Premstaetten (DE)

( * ) Notice: Subject to any disclaimer, the term of this patent is extended or adjusted under 35 U.S.C. 154(b) by 0 days.

(21) Appl. No.: 17/881,664

(22) Filed: Aug. 5, 2022

(65) Prior Publication Data

US 2024/0048133 A1  Feb. 8, 2024

(51) Int. Cl.
*H03K 5/135* (2006.01)
*G06F 13/42* (2006.01)
*H03L 7/099* (2006.01)

(52) U.S. Cl.
CPC ......... *H03K 5/135* (2013.01); *G06F 13/4291* (2013.01); *H03L 7/0991* (2013.01)

(58) Field of Classification Search
None
See application file for complete search history.

(56) References Cited

U.S. PATENT DOCUMENTS

| 2018/0196465 A1 | 7/2018 | Sharpe-Geisler |
| 2019/0347239 A1* | 11/2019 | Mishra ............... G06F 13/4291 |
| 2023/0131042 A1 | 4/2023 | Lysov et al. |

FOREIGN PATENT DOCUMENTS

| CN | 112015228 A | 12/2020 |
| CN | 112149368 A | 12/2020 |
| DE | 102020202400 A1 | 8/2021 |
| JP | 2020129756 A | 8/2020 |

OTHER PUBLICATIONS

International Search Report of corresponding International Patent Application PCT/EP2023/071268, dated Oct. 9, 2023, 11 pages (for informational purposes only).

* cited by examiner

*Primary Examiner* — Cassandra F Cox
(74) *Attorney, Agent, or Firm* — Viering, Jentschura & Partner mbB

(57) ABSTRACT

A device comprises a data terminal, a clock terminal and a digital circuitry. The data terminal is configured to be connected to a serial data line. The clock terminal is configured to be connected to a serial clock line for receiving a clock signal. The digital circuitry is coupled to the data terminal and to the clock terminal. The digital circuitry is configured to operate using a time base signal provided via a further clock terminal to the device or using an internal clock signal that is generated by an internal oscillator of the device.

Furthermore, a method for operating a device is described.

15 Claims, 4 Drawing Sheets

DEVICE WITH CLOCK TERMINAL AND METHOD FOR OPERATING A DEVICE

TECHNICAL FIELD

A device with a clock terminal, an arrangement with a device and a method for operating a device are provided.

BACKGROUND

A device often requires an exact clock signal for its operation. The device is realized e.g. as optical sensor. The optical sensor is able to detect e.g. ambient light containing some flicker light. An exact clock signal is useful for determining a frequency of the flicker light.

SUMMARY

In an embodiment, a device comprises a data terminal, a clock terminal and a digital circuitry. The data terminal is configured to be connected to a serial data line, abbreviated SDA. The clock terminal is configured to be connected to a serial clock line, abbreviated SCL, for receiving a clock signal. The digital circuitry is coupled to the data terminal and to the clock terminal. The digital circuitry is configured to operate using a time base signal provided via a further clock terminal to the device or using an internal clock signal generated by an internal oscillator of the device.

Advantageously, the digital circuitry receives the time base signal or the internal clock signal and thus obtains a reliable and continuous clock signal.

In an embodiment, the device is configured as optical sensor.

In an embodiment of the device, the digital circuitry is configured to provide a data signal at the data terminal as a function of flicker light detected by the device or depending on flicker light detected by the device.

In an embodiment, the device is configured to generate a frequency information of the flicker light by means of the time base signal or the internal clock signal. The device is configured to provide the data signal comprising the frequency information of the flicker light.

In an embodiment, the device is configured to provide the data signal as a function of a relation of the internal clock signal and the clock signal. The relation is a parameter such as e.g. a period of the clock signal divided by a period of the internal clock signal or a multiple of periods of the clock signal divided by a period of the internal clock signal. Advantageously, this relation is used e.g. by a host for correcting the data signal that comprises the frequency information of the flicker light.

In an embodiment, the internal oscillator is configured to provide the internal clock signal to the digital circuitry. The internal clock signal is adjusted or tuned by means of the clock signal. In an example, the clock signal only obtains pulses during data transmission and is absent otherwise. Thus, the clock signal is not a signal having continuously pulses over a long duration and thus, the internal clock signal is not derived from the clock signal e.g. by a frequency divider, buffer or frequency multiplier which receives the clock signal.

In an embodiment, the device comprises a comparison circuitry and an adjustment circuitry. A first input of the comparison circuitry is coupled to the output of the internal oscillator. A second input of the comparison circuitry is coupled to the clock terminal of the device. An output of the comparison circuitry is coupled to an input of the adjustment circuitry. An output of the adjustment circuitry is coupled to the internal oscillator.

In an embodiment of the device, a frequency of the internal clock signal is higher than a frequency of the clock signal.

In an embodiment of the device, the comparison circuitry of the device is configured to count pulses of the internal clock signal during a pulse, multiple pulses, a period or multiple periods of the clock signal.

In an embodiment of the device, the adjustment circuitry is configured to adjust a frequency or period of the internal clock signal using an output signal of the comparison circuitry.

In an embodiment of the device, the comparison circuitry is configured to perform a comparison over a series of pulses of the clock signal.

In an embodiment, the device is configured to adjust a frequency or period of the internal clock signal exclusively using a first number N of pulses of the clock signal or a first number N of periods of the clock signal. In an example, the first number N is predetermined. Optionally, the first number N is larger than 0 and less than e.g. 10 or less than 200. Optionally, after an adjustment phase, the internal oscillator is free running up to a next adjustment phase in which again only the first number N of pulses or periods of the clock signal are used for adjustment.

In an embodiment of the device, the internal oscillator is a free-running clock.

In an example, the internal oscillator is adjusted in an adjustment period by setting at least one clock parameter. The internal oscillator is free running in a measurement period using the set at least one clock parameter. The device detects the flicker light during the measurement period. In an example, the measurement period follows the adjustment period.

In an embodiment, an arrangement comprises the device and a host with a host clock terminal and a host data terminal. Moreover, the arrangement comprises a serial clock line (abbreviated SCL) coupled to the clock terminal of the device and to the host clock terminal. The arrangement comprises a serial data line (abbreviated SDA) coupled to the data terminal of the device and to the host data terminal.

In an embodiment of the arrangement, the arrangement comprises a bus. The host and the device are connected to each other via the bus. The bus is realized e.g. as an I2C bus, an I3C bus or a SPI bus. The bus includes the serial data line and the serial clock line. I2C is the abbreviation for inter-integrated circuit. I3C is the abbreviation for improved inter integrated circuit. SPI is the abbreviation for serial peripheral interface.

In an embodiment, the arrangement further comprises a time base which is configured to provide the time base signal. The time base has an output coupled to a host clock input of the host.

In an embodiment, the arrangement further comprises a connection line which is coupled to the output of the time base and to the further clock terminal of the device.

In an embodiment, the arrangement is free of a connection line which is directly connected to the output of the time base and to an input of the device.

In an embodiment, a method for operating a device comprises
providing a data signal to a data terminal of the device,
providing a clock signal to a clock terminal of the device, and operating the device using a time base signal provided via a further clock terminal to the device or using an internal clock signal generated by an internal oscillator.

The device and the arrangement described above are particularly suitable for the method for operating a device. Features described in connection with the device and the arrangement can therefore be used for the method and vice versa.

In an embodiment of the method, the internal clock signal is adjusted or tuned by means of the clock signal.

In an embodiment, a device uses an I2C, I3C or SPI clock as a reference clock.

In an embodiment, an application for this device is for flicker detection for a camera application in a mobile phone.

In an embodiment, a mobile phone includes the device. The device is configured for flicker detection. The flicker detection provided by the device enhances e.g. a performance of a camera in the mobile phone. The mobile phone comprises the arrangement.

In an embodiment, an advantage is that customers are able to discern subtle differences (<1 Hz) in ambient lighting frequencies (also known as flicker) to allow them to enhance camera performance. An accuracy of the determination of flicker frequencies is improved. For example, a clock signal of an I2C bus is used as reference.

In an embodiment, the device is configured to use a frequency or a period of the clock signal of an I2C bus, I3C bus or SPI bus as reference for a frequency or a period of an internal clock signal of the device.

In an embodiment, the device uses an existing external clock source which is accurate to adjust an internal oscillator which is a local onboard clock source and which is less accurate with low complexity and low cost.

In an embodiment, instead of using a separate external clock reference, the device uses the serial bus communication clock as a source of a reference clock timing to adjust the accuracy of the internal asynchronous clock.

In an embodiment, the device compares the difference between the external clock signal (which may be named serial communications clock signal) and the internal clock signal by using digital counters or a similar digital comparison. The result accumulated in the counters or the outcome of the digital comparison is then used to adjust the internal oscillator to accuracy close to the accuracy of the external clock source.

In an example, an advantage of this technique is that a separate external clock reference is not required which allows the product to be smaller with less complexity and cost.

In an alternative embodiment, an accurate external oscillator such as a serial communications clock is directly routed to the device.

BRIEF DESCRIPTION OF THE DRAWINGS

The following description of figures of examples or embodiments may further illustrate and explain aspects of the device, the arrangement and the method for operating the device. Arrangements, devices and circuit blocks with the same structure and the same effect, respectively, appear with equivalent reference symbols. In so far as arrangements, devices and circuit blocks correspond to one another in terms of their function in different figures, the description thereof is not repeated for each of the following figures.

DETAILED DESCRIPTION OF ILLUSTRATIVE EMBODIMENTS

Figure 1:
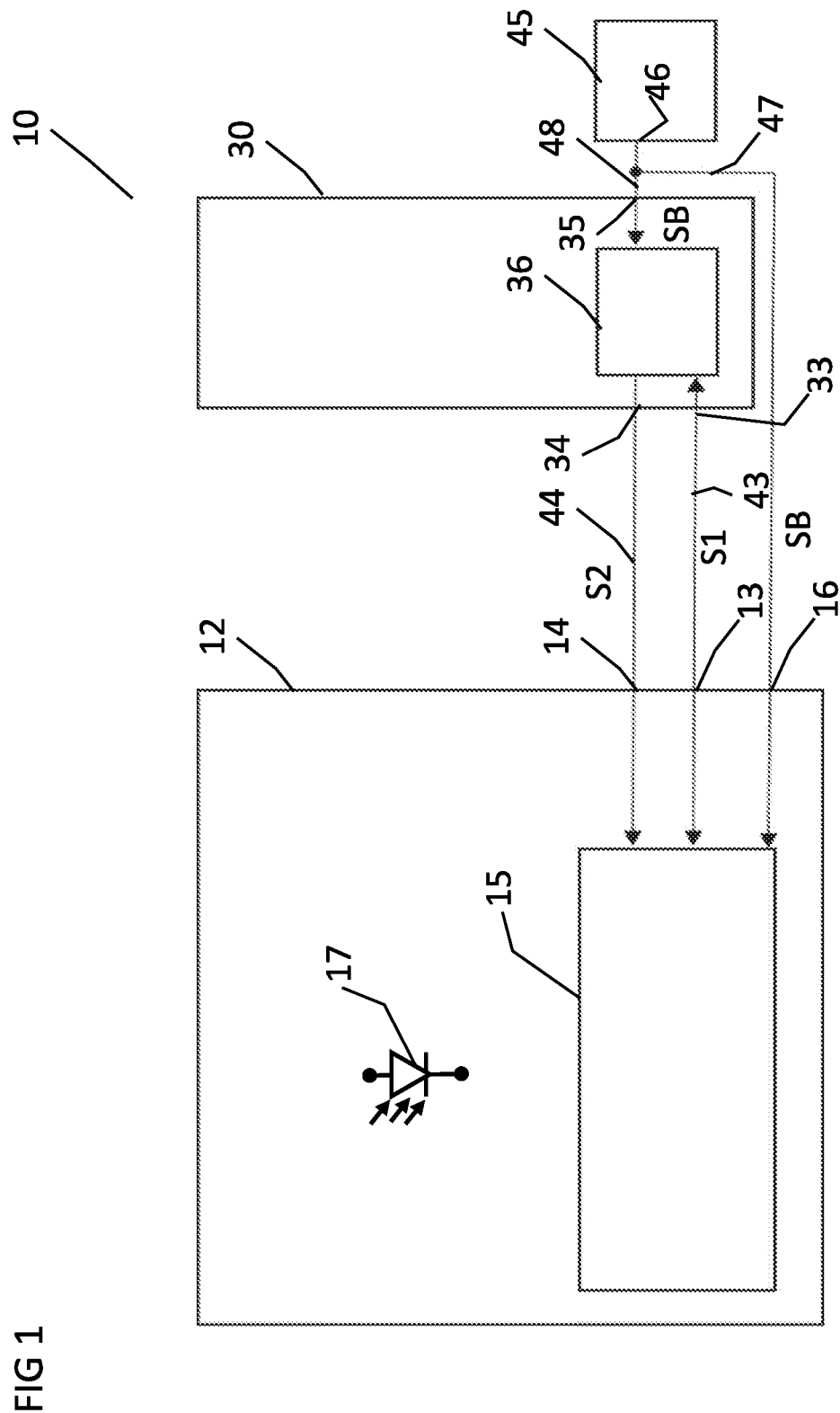
FIG. 1 shows an exemplary embodiment of an arrangement with a device.

FIG. 1 shows an exemplary embodiment of an arrangement 10 with a device 12. The device 12 comprises a data terminal 13 and a clock terminal 14. The device 12 includes a digital circuitry 15 coupled or connected to the data terminal 13 and to the clock terminal 14.

The arrangement 10 comprises a host 30 with a host data terminal 33 and a host clock terminal 34. The host 30 is realized e.g. as an application processor, microprocessor or microcontroller. The arrangement 10 incorporates a serial data line 43 and a serial clock line 44. The serial data line 43 couples or connects the host data terminal 33 to the data terminal 13 of the device 12. The serial clock line 44 couples or connects the host clock terminal 34 to the clock terminal 14 of the device 12. In an example, the host 30 is implemented as a master and the device 12 is implemented as a slave.

Moreover, the arrangement 10 further comprises a time base 45 with an output 46. The arrangement 10 comprises a connection line 47 which couples or connects the output 46 of the time base 45 to a further clock terminal 16 of the device 12. The further clock terminal 16 is connected to the digital circuitry 15. The output 46 of the time base 45 is coupled or connected to a host clock input 35 of the host 30 via a further connection line 48.

The host 30 includes a digital logic 36 connected to the host data terminal 33, the host clock terminal 34 and the host clock input 35.

The host 30 generates a data signal S1 at the host data terminal 33 and provides the data signal S1 via the serial data line 43 to the data terminal 13 of the device 12. The device 12 is also able to generate the data signal S1 at the data terminal 13 and to provide the data signal S1 via the serial data line 43 to the host data terminal 33. The host 30 and the device 12 are configured for bidirectional data communication via the serial data line 43. The data signal S1 is implemented as serial data signal.

The host 30 generates a clock signal S2 at the host clock terminal 34 and provides the clock signal S2 via the serial clock line 44 to the clock terminal 14 of the device 12. The clock terminal 14 is an input terminal. The clock signal S2 is implemented as serial clock signal. The data signal S1 and the clock signal S2 are generated according to an I2C, I3C or SPI protocol.

The time base 45 generates a time base signal SB at the output 46 of the time base 45. The time base 45 provides the time base signal SB via the connection line 47 to the further clock terminal 16 of the device 12.

The digital circuitry 15 operates using the time base signal SB. The device 12 is configured as optical sensor. The digital circuitry 15 provides the data signal S1 at the data terminal 13. The data signal S1 is provided e.g. as a function of flicker light detected by the device 12, e.g. by a light sensor 17 of the device 12. The light sensor 17 is e.g. a photodiode.

Moreover, the device 12 generates a frequency information of the flicker light by means of the time base signal SB and provides the data signal S1 comprising the frequency information of the flicker light. In an example, the host 30 adjusts an exposure time or a frame rate of a not shown camera or image sensor of the arrangement 10. In an example, the arrangement 10 is implemented as one of a camera, a computer or a device for mobile communication. The arrangement 10 is implemented e.g. as one of a mobile phone, a smartphone, a tablet computer, a desktop computer, a laptop, a notebook computer, a video game console or a handheld game console.

Thus, the data signal S1 is provided to the data terminal 13 of the device 12 by the host 30, in case the host 30 delivers information or a command. Alternatively, the data signal S1 is provided by the device 12, in case the device 12 delivers information. The clock signal S2 is provided to the clock terminal 14 of the device 12 by the host 30. The data signal S1 and the clock signal S2 are evaluated by the digital circuitry 15 of the device 12. For example, the digital circuitry 15 evaluates the data signal S1 and the clock signal S2 to recognize a start and a stop condition of a transaction, to check an address written in the data signal S1 or to store data contained by the data signal S1 in a memory of the device 12. The digital circuitry 15 operates using the time base signal SB provided via the further clock terminal 16 to the device 12.

A frequency of the time base signal SB is higher than a frequency of the clock signal S2. In FIG. 1, the time base 45 which is an accurate clock source is directly routed to the device 12.

In an example, the device 12 includes an internal clock source (not shown) which uses the time base signal SB for generating an internal clock signal. E.g. the internal clock source uses a frequency divider or frequency multiplier to generate the internal clock signal with a frequency lower or higher than a frequency of the time base signal SB.

Figure 2:
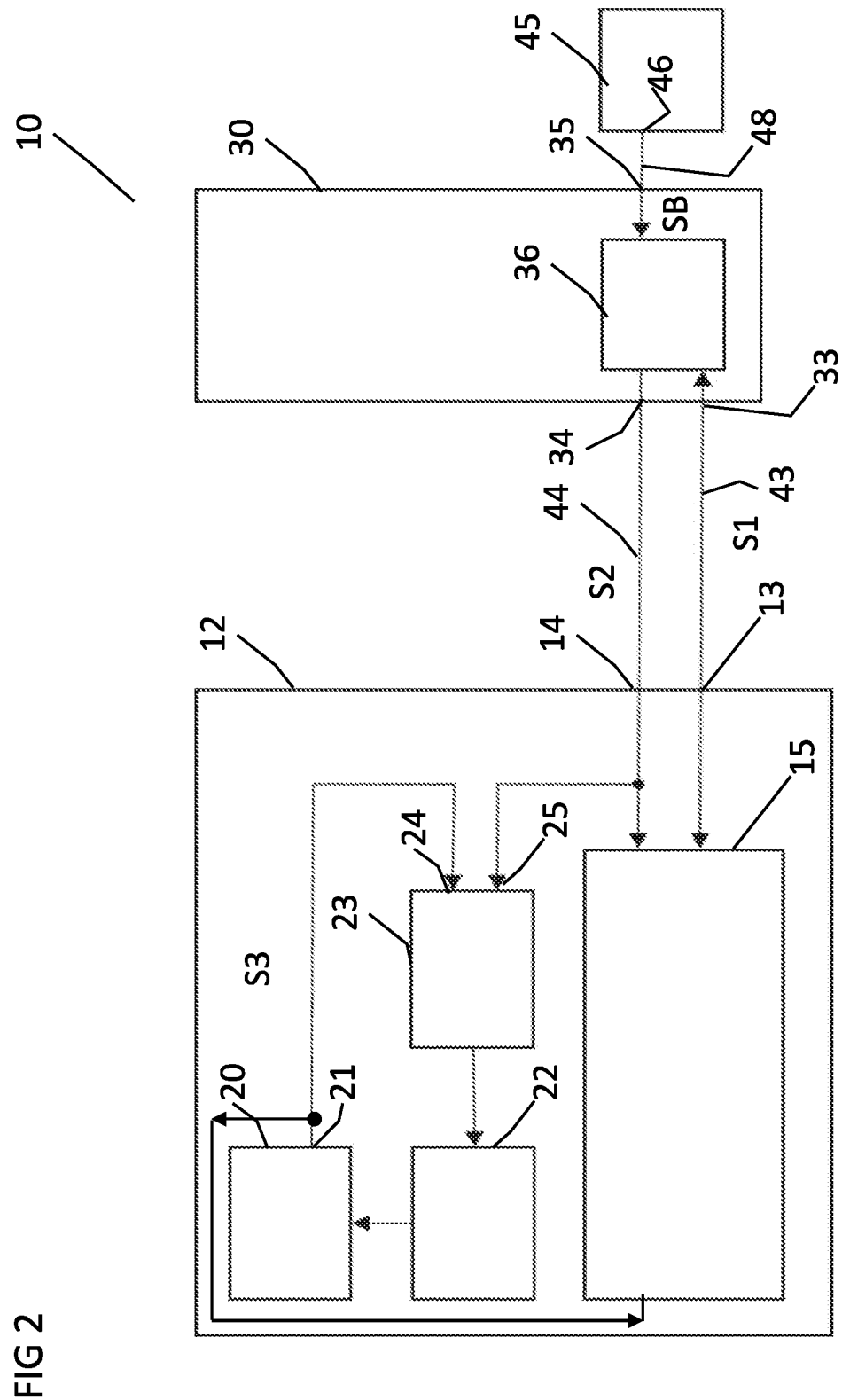
FIG. 2 shows a further exemplary embodiment of an arrangement with a device.

FIG. 2 shows a further exemplary embodiment of an arrangement 10 with a device 12 which is a further development of the embodiment shown in FIG. 1. The device 12 comprises an internal oscillator 20. An output 21 of the internal oscillator 20 is coupled to the digital circuitry 15. The device 12 comprises an adjustment circuitry 22 with an output coupled to an input of the internal oscillator 20. The device 12 comprises a comparison circuitry 23. An input of the adjustment circuitry 22 is coupled via the comparator circuitry 23 to the clock terminal 14 of the device 12 and to the output 21 of the internal oscillator 20.

An output of the comparison circuitry 23 is connected to the input of the adjustment circuitry 22. The comparison circuitry 23 has a first input 24 coupled or connected to the output 21 of the internal oscillator 20. A second input 25 of the comparison circuitry 23 is coupled or connected to the clock terminal 14 of the device 12. The comparison circuitry 23 is realized e.g. as digital comparison circuitry.

The internal oscillator 20 is realized e.g. a resistive-capacitive clock source or oscillator.

The internal oscillator 20 is realized e.g. as an onboard clock source. In an example, the device 12 comprises a printed circuit board on which the parts of the device 12 are located. The parts of the device 12 comprise the digital circuitry 15, the internal oscillator 20, the adjustment circuitry 22 and the comparison circuitry 23. Alternatively, the internal oscillator 20 is realized e.g. as an on-chip clock source. The device 12 comprises a semiconductor substrate on which the parts of the device 12 are integrated.

The internal oscillator 20 generates an internal clock signal S3. The internal oscillator 20 provides the internal clock signal S3 by means of the clock signal S2. The clock signal S2 is only used to adjust or tune the internal clock signal S3 when it is necessary. The internal oscillator 20 applies the internal clock signal S3 to the digital circuitry 15. The digital circuitry 15 operates using the internal clock signal S3. The digital circuitry 15 generate the frequency information of the flicker light by means of the internal clock signal S3 and provides the data signal S1 comprising the frequency information of the flicker light. In an example, the frequency of the flicker light can be determined with a resolution better than 5 Hz, better than 2 Hz, better than 1 Hz, better than 0.5 Hz or better than 0.1 Hz.

A frequency of the internal clock signal S3 is higher than a frequency of the clock signal S2. In an example, the comparison circuitry 23 counts pulses of the internal clock signal S3 during a pulse or a period of the clock signal S2 or during multiple pulses or multiple periods of the clock signal S2. The adjustment circuitry 22 adjusts a frequency or period of the internal clock signal S3 using an output signal of the comparison circuitry 23. The comparison circuitry does the comparison exclusively using a first number N of pulses of the clock signal S2. The first number N of pulses is 1, 2, 3 or more than 0, more than 1 or more than 2. The first number N is less than 200, less than 145, less than 10, less than 8, less than 6 or less than 4.

In an example, the clock signal S2 is not a continuous clock signal. According to the specification of an I2C bus, I3C bus or SPI bus, the clock signal S2 obtains pulses only during data transmission via the data signal S1. For example, n bits are transmitted serially via the serial data line 43. Typically, the clock signal S2 obtains n+1 pulses. Thus, one bit transmitted by the data signal S1 corresponds to one pulse of the clock signal S2. One or more of the pulses or one or more of the periods of the clock signal S2 is used to perform the adjustment of the internal oscillator 20, e.g. to determine at least one adjustment parameter. The at least one adjustment parameter is stored by the device 12 and used to tune or adjust the internal oscillator 20. When the clock signal S2 does not show pulses, the internal oscillator 20 is free-running. The digital circuitry 15 operates using the internal clock signal S3 adjusted by the clock signal S2 and generated by the internal oscillator 20.

The digital logic 36 of the host 30 generates the clock signal S2 using the time base signal SB. Thus, the frequency and/or periods of the internal clock signal S3 depend on the frequency and/or periods of the clock signal S2 which in turn depend on the frequency and/or periods of the time base signal SB.

The time base 45 is implemented as accurate time base. The time base 45 includes e.g. a quartz crystal or a micro-electro-mechanical systems device, abbreviated MEMS device, for frequency generation. Thus, the frequency and/or periods of the time base signal SB are generated with high accuracy. Since the internal clock signal S3 indirectly depends on the time base signal SB, therefore, the frequency and/or periods of the internal clock signal S3 are generated with high accuracy (which is e.g. a bit less than the accuracy of the time base signal SB).

Advantageously, the arrangement 10 is free of a connection line which is directly connected to the output 46 of the time base 45 and to an input of the device 12. The digital circuitry 15 does not operate by directly using the time base signal SB. Advantageously, the number of pins of the device 12 can be kept low.

Advantageously, the device 12 uses a frequency or a period of the clock signal S2 of an I2C, I3C or SPI bus as reference for a frequency or a period of an internal clock signal S3 of the device 12.

In an example, the device 12 compares the difference between the external clock signal S2 and the internal clock signal S3 by using digital counters or a similar digital comparison. The result accumulated in the counters or the outcome of the digital comparison can then be used to adjust the internal oscillator 20 to accuracy close to the accuracy of the time base signal SB.

In an alternative embodiment, the device 12 provides information about a difference between the internal clock signal S3 and the clock signal S2 to the host 30. Thus, instead of adjusting the internal oscillator 20, the device 12 reports the difference between the internal oscillator 20 and an external clock source, e.g. a clock source inside the host 30 or the time base 45.

Figure 3A:
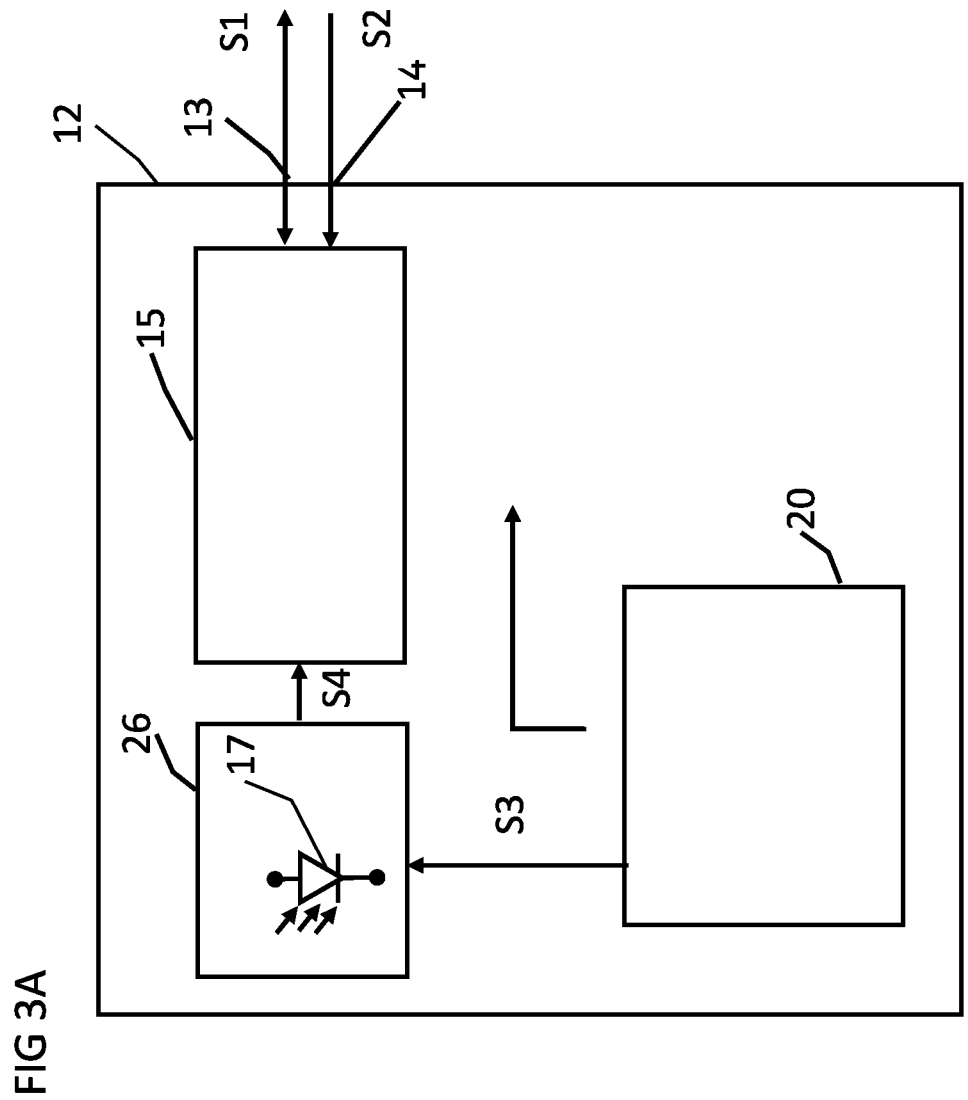
FIGS. 3A and 3B show exemplary embodiments of details of a device.

FIG. 3A shows an exemplary embodiment of a device 12 which is a further development of the embodiments shown in FIGS. 1 and 2. The device 12 comprises the digital circuitry 15 and the internal oscillator 20. Furthermore, the device 12 comprises a sampling circuit 26. An output of the internal oscillator 20 is connected to an input of the sampling circuit 26. A terminal of the sampling circuit 26 is coupled to a terminal of the digital circuitry 15. The terminal of the sampling circuit 26 is realized e.g. as an output or output/input. The terminal of the digital circuitry 15 is realized e.g. as an input or output/input. The internal oscillator 20 is e.g. a silicon based oscillator. The internal oscillator 20 may have a temperature drift, life time drift and/or process drift. The internal oscillator 20 provides the internal clock signal S3 to the sampling circuit 26. The sampling circuit 26 may include the light sensor 17.

The data signal S1 is implemented as serial data signal. The data signal S1 is generated using a bus protocol by the digital circuitry 15 and by the host 30. The bus protocol is e.g. an I2C, I3C or SPI bus protocol.

The clock signal S2 is a serial clock signal. The host 30 generates the clock signal S2 using the above mentioned bus protocol. The clock signal S2 includes a clock burst (e.g. based on the I2C, I3C or SPI bus protocol) or is a continuous signal. In other words, the number of pulses of the clock signals S2 either has a predetermined maximum value (in case of the I2C, I3C or SPI bus protocol) or has not a predetermined value (in case of a continuous signal). Optionally, the clock signal S2 may be a temperature compensated and trimmed clock base from the host 30 and thus can be used advantageously as reference clock signal.

The sampling circuit 26 is realized as coherent sampling system. For example, the sampling circuit 26 samples light. The sampling circuit 26 applies the internal clock signal S3 as sampling time base or sample clock. The sampling circuit 26 generates an internal signal S4 and provides it to the digital circuitry 15. The internal signal S4 is e.g. a data signal. The digital circuitry 15 is configured for data processing. The digital circuitry 15 performs a fast Fourier transform, abbreviated FFT, or a time based sampling. The digital circuitry 15 generates the data signal S1 after data processing of the internal signal S4.

In an example, an error of the internal oscillator 20 can directly be seen in the sample time which is the FFT time base and thus in the FFT bins.

Optionally, the device includes the further clock terminal 16 (as shown in FIG. 1) and receives the time base signal SB. The internal oscillator 20 is controlled by the time base signal SB. In an example, the device 12 includes a phase locked-loop which controls the internal oscillator 20 as a function of the time base signal SB.

Figure 3B:
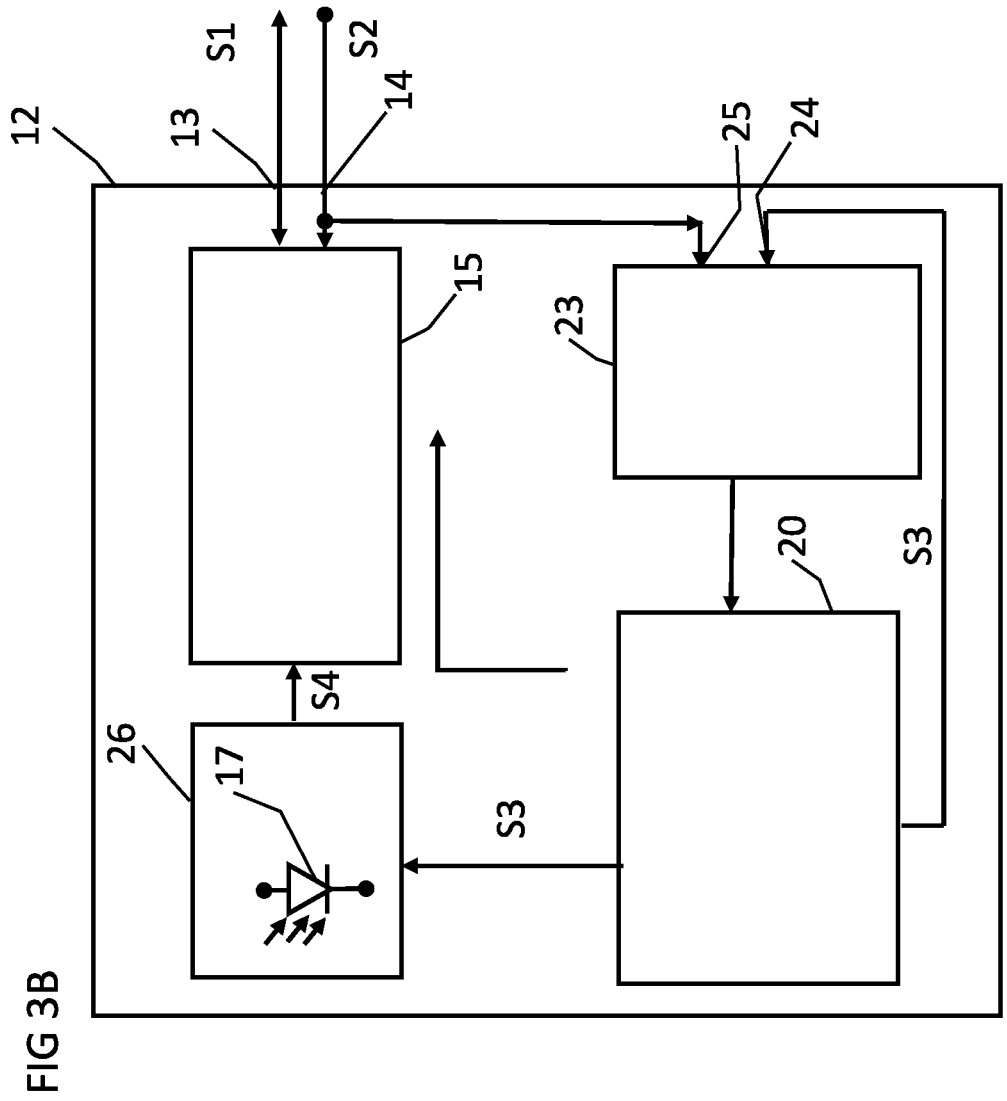

FIG. 3B shows an exemplary embodiment of a device 12 which is a further development of the embodiments shown in FIGS. 1, 2 and 3A. The comparison circuitry 23 is coupled at the first input 24 to the output of the internal oscillator 20 and at the second input 25 to the clock terminal 14. The comparison circuitry 23 compares the internal clock signal S3 and the clock signal S2. The comparison circuitry 23 performs a sampling or oversampling of the clock signal S2 and on the internal clock signal S3. The comparison circuitry 23 compares a difference between the internal clock signal S3 and the clock signal S2 to a given clock target. The comparison circuitry 23 performs a correction of the internal oscillator 20 directly or via the adjustment circuit 22 (shown in FIG. 2). The internal clock signal S3 is a corrected signal adjusted by means of the clock signal S2.

In an example, an error of the internal oscillator 20 can directly be seen in the sample time which is the FFT time base and thus in the FFT bins. Advantageously, the error of the internal clock signal S3 is reduced based on the accuracy of the clock signal S2.

For example, a frequency of the internal clock signal S3 is higher than a frequency of the clock signal S2. Thus, the comparison circuitry 23 counts the number of pulses of the internal clock signal S3 which are in a pulse, multiple pulses, a period or multiple periods of the clock signal S2. The comparison circuitry 23 compares the number of pulses of the internal clock signal S3 with a predetermined value and adjusts the internal oscillator 20. Thus, the frequency accuracy of the internal oscillator 20 can be improved.

In an example, the device 12 is free from a phase-locked loop, abbreviated PLL. In case the clock signal S2 only has a predetermined number of pulses (e.g. typically 9 in case of an I2C bus or typically 16*9=144 in case of an I3C bus), a conventional PLL cannot operate for adjusting or generating the internal clock signal S3, because typically a reference clock for a PLL has to be continuous and the clock signal S2 may be not continuous. The internal clock signal S3 should be generated as a continuous signal.

In an alternative embodiment, the comparison circuitry 23 as discussed above can also be realized in the embodiment of the device 12 shown in FIG. 3A. The output of the comparison circuitry 23 is connected to the digital circuitry 15. Thus, the comparison circuitry 23 provides a frequency relationship or a period relationship between the clock signal S2 and the internal clock signal S3 to the digital circuitry 15 and thus to the host 30.

The invention is not limited to the description of the embodiments. Rather, the invention comprises each new feature as well as each combination of features, particularly each combination of features of the claims, even if the feature or the combination of features itself is not explicitly given in the claims or embodiments.

REFERENCES 10 arrangement
12 device
13 data terminal
14 clock terminal
15 digital circuitry
16 further clock terminal
17 light sensor
20 internal oscillator
21 output
22 adjustment circuitry
23 comparison circuitry
24, 25 input
26 sampling circuit
30 host
33 host data terminal
34 host clock terminal
35 host clock input
36 digital logic 43 serial data line
44 serial clock line
45 time base
46 output
47, 48 connection line
SB time base signal
S1 data signal
S2 clock signal
S3 internal clock signal
S4 internal signal

The invention claimed is:

1. A device comprising:
a data terminal configured to be connected to a serial data line,
a clock terminal configured to be connected to a serial clock line for receiving a clock signal, and
a digital circuitry coupled to the data terminal and to the clock terminal,
wherein the digital circuitry is configured to operate based on a time base signal provided via a further clock terminal to the device or based on an internal clock signal generated by an internal oscillator of the device, wherein the device is configured to adjust the internal oscillator based on the clock signal and wherein the digital circuitry is configured to provide a data signal at the data terminal based on a detection of flicker light detected by the device.

2. The device of claim 1,
wherein the device is configured as an optical sensor.

3. The device of claim 1,
wherein the device is configured to generate a frequency information of the flicker light based on the time base signal or the internal clock signal, and wherein the data signal includes the frequency information of the flicker light.

4. The device of claim 1,
wherein the device is configured to provide the data signal based on a relation between the internal clock signal and the clock signal.

5. The device of claim 1,
further comprising a comparison circuitry and an adjustment circuitry,
wherein a first input of the comparison circuitry is coupled to the output of the internal oscillator,
wherein a second input of the comparison circuitry is coupled to the clock terminal of the device,
wherein an output of the comparison circuitry is coupled to an input of the adjustment circuitry, and
wherein an output of the adjustment circuitry is coupled to the internal oscillator.

6. The device of claim 5,
wherein a frequency of the internal clock signal is higher than a frequency of the clock signal, and
wherein the comparison circuitry is configured to count pulses of the internal clock signal during a pulse, multiple pulses, a period or multiple periods of the clock signal.

7. The device of claim 5,
wherein the adjustment circuitry is configured to adjust a frequency or period of the internal clock signal based on an output signal of the comparison circuitry.

8. An arrangement comprising:
the device of claim 1,
a host with a host clock terminal and a host data terminal,
the serial clock line coupled to the clock terminal of the device and to the host clock terminal, and
the serial data line coupled to the data terminal of the device and to the host data terminal.

9. The arrangement of claim 8,
wherein the arrangement further comprises a time base configured to provide the time base signal, and wherein the time base has an output coupled to a host clock input of the host.

10. The arrangement of claim 9,
wherein the arrangement further comprises a connection line coupled to the output of the time base and to the further clock terminal of the device.

11. The arrangement of claim 9,
wherein the arrangement is free of a connection line which is directly connected to the output of the time base and to an input of the device.

12. The arrangement of claim 8,
further comprising a bus configured as one of an I2C bus, an I3C bus, or a SPI bus; and
wherein the bus comprises the serial clock line and the serial data line.

13. The device of claim 1, further comprising a light sensor configured to detect flicker light.

14. A device comprising:
a data terminal configured to be connected to a serial data line;
a clock terminal configured to be connected to a serial clock line for receiving a clock signal; and
a digital circuitry coupled to the data terminal and to the clock terminal;
wherein the digital circuitry is configured to operate based on a time base signal provided via a further clock terminal to the device or based on an internal clock signal generated by an internal oscillator of the device, and
wherein the device is configured to adjust the internal oscillator based on the clock signal.

15. An arrangement comprising:
a device comprising:
a data terminal connected to a serial data line,
a clock terminal connected to a serial clock line and configured to receive a clock signal, and
a digital circuitry coupled to the data terminal and to the clock terminal,
wherein the digital circuitry is configured to operate based on a time base signal provided via a further clock terminal to the device or based on an internal clock signal generated by an internal oscillator of the device, and wherein the device is configured to adjust the internal oscillator based on the clock signal;
a host with a host clock terminal and a host data terminal;
wherein the serial clock line is coupled to the host clock terminal, and wherein the serial data line is coupled to the host data terminal.

* * * * *